United States Patent [19]

Briggs

[11] 4,017,741
[45] Apr. 12, 1977

[54] DYNAMIC SHIFT REGISTER CELL

[75] Inventor: George Roland Briggs, Princeton, N.J.

[73] Assignee: RCA Corporation, New York, N.Y.

[22] Filed: Nov. 13, 1975

[21] Appl. No.: 631,458

[52] U.S. Cl. .......................... 307/221 C; 307/208; 307/246; 307/279

[51] Int. Cl.[2] ................ G11C 19/28; G11C 19/18; H03K 23/26; H03K 17/60

[58] Field of Search .......... 307/205, 214, 208, 246, 307/221 R, 221 C, 224 C, 269, 279, 220 R, 220 C, 288

[56] References Cited

UNITED STATES PATENTS

| | | | |
|---|---|---|---|
| 3,524,077 | 8/1970 | Kaufman | 307/205 X |
| 3,651,342 | 3/1972 | Dingwall | 307/208 X |
| 3,838,293 | 9/1974 | Shah | 307/221 C X |
| 3,866,186 | 2/1975 | Suzuki | 307/205 X |

OTHER PUBLICATIONS

Cordard et al., "High-Density/High-Performance Two-Phase Shift Register Cell"; *IBM Tech. Discl. Bull.;* vol. 16, No. 3, pp. 1012-1013, 8/1973.

Reynolds et al., "Metal-Oxide-Semiconductor (MOS) Integrated Circuits"; *Post. Off. Electrical Engrs. J.* (Gt. Brit.), vol 63, pt. 2 (7/19700); pp. 105-112.

Parrish et al., "Four-Phase High-Speed Shift Register"; *IBM Tech. Discl. Bull.;* vol. 13, No. 1, pp. 23-24, 6/1970.

*Primary Examiner*—John S. Heyman
*Assistant Examiner*—Larry N. Anagnos
*Attorney, Agent, or Firm*—H. Christoffersen; S. Cohen; F. R. Perillo

[57] ABSTRACT

A CMOS shift register cell comprising four transistors and two capacitance elements. Data is temporarily stored in the cell by precharging one capacitance through one of the transistors and then discharging it or not through another of the transistors depending on the input signal level. The second capacitance may be precharged through the third transistor and then discharged or not through the fourth transistor, depending upon the value of the temporarily stored charge.

12 Claims, 5 Drawing Figures

DYNAMIC SHIFT REGISTER CELL

In the design of dynamic shift registers it is highly desirable to utilize circuits having a minimal number of active devices per stage. This reduces the cost of the register and, when realized in integrated circuit form, implies higher packing density in view of the reduced die area occupied per stage.

One system known in the prior art utilizes four metal-oxide-semiconductor (MOS) transistors of the same conductivity type and three capacitors per register stage. Three clock phases are required. While utilizing a relatively small number of components, this circuit has at least two potential problems. For certain dynamic voltage conditions, some of the register transistors operate in the source-follower mode. This is undesirable because of the relatively slow transistor switching speed associated with this mode which limits the maximum data rate of the register.

Secondly, the circuit functions, in part, by transferring charge between first and second capacitors. Such a means of information transfer, because of capacitive voltage divider effects, causes the second capacitor to charge to a voltage less than that across the first. To minimize this problem, the first capacitor must be several times larger than the second. This is to ensure that the voltage across the second capacitor will be safely in exccess of the threshold voltage of any transistor that is switched by this voltage. Such an information transfer technique unduly restricts the range of permissible operating voltages for the register circuit. In addition, it may be impractical to realize the relatively large values of capacitance through the use of integrated circuit fabrication techniques. The circuits of the present application have a lower component count than the above described circuit and avoid the above problems. One embodiment, requiring 3 clock phases, is capable of operating at very high speed and another, 2 phase design, requires fewer clock phases than the prior art circuit.

IN THE DRAWINGS

Figure 1:
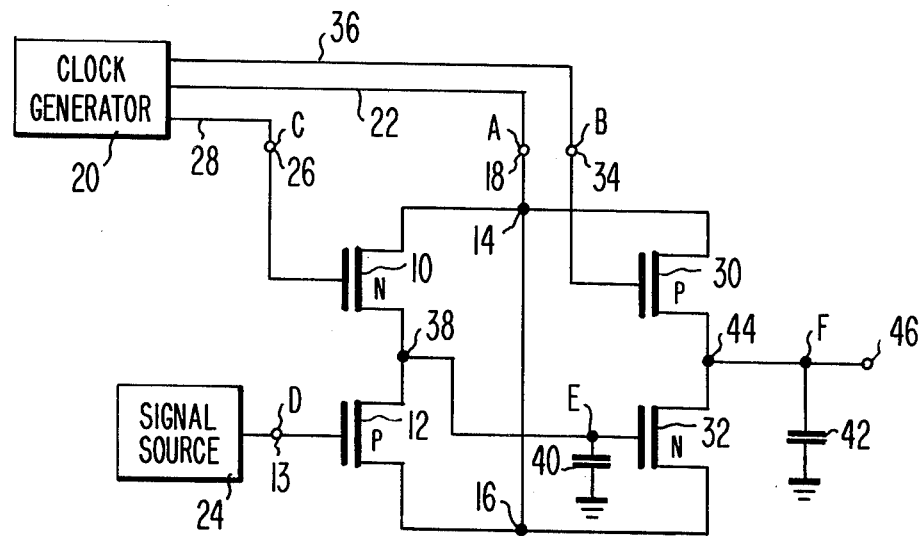
FIG. 1 is a block and schematic circuit diagram of a preferred embodiment of the invention.

In the circuit of FIG. 1, the conduction paths of NMOS transistor 10 and PMOS transistor 12 are serially-connected between nodes 14 and 16. These nodes are both connected to terminal 18 which in turn is connected to output line 22 of clock generator 20. The gate of transistor 12 is connected at input terminal 13 to signal source 24 while the gate of transistor 10 is connected at terminal 26 to output line 28 of generator 20. The conduction paths of PMOS transistor 30 and NMOS transistor 32 are serially connected between nodes 14 and 16. The gate of transistor 30 is connected at terminal 34 to output line 36 of generator 20. The gate of transistor 32 is connected at node 38 to the common connection between the conduction paths of transistors 10 and 12. Capacitor 40 is connected between the gate of transistor 32 and a point at a reference potential, herein ground. Capacitor 42 is connected between node 44, at the common connection of the conduction paths of transistors 30 and 32, and the reference potential. Also connected to node 44 is circuit output terminal 46.

Figure 3:
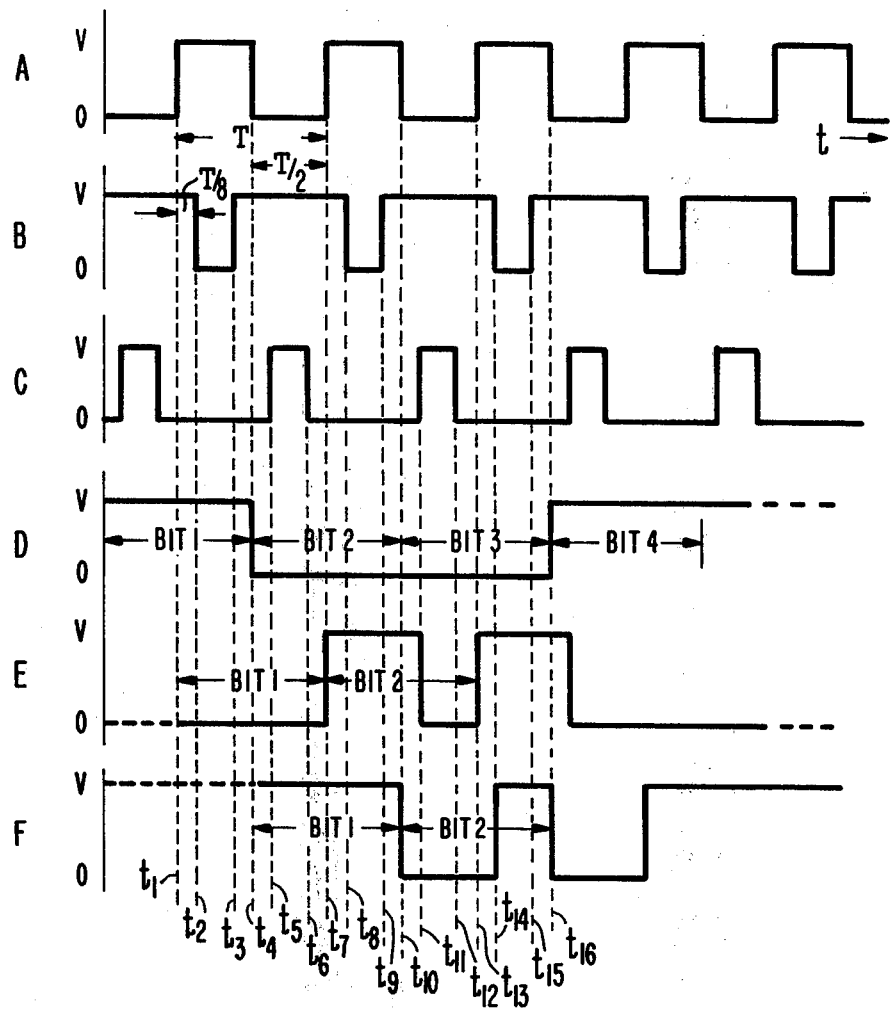
FIG. 3 and 4 show waveforms used to explain the operation of the circuits of FIGS. 1 and 2, respectively.

In the operation of the circuit of FIG. 1, the clock generator signals (pulses) shown in FIG. 3 at A, B, and C are applied to terminals 18, 34 and 26, respectively. These pluses vary in amplitude between a high level of +V of volts and a low level of zero volts. The input data is the signal D supplied by source 24. The signal D shown by way of illustration in FIG. 3 represents the binary sequence 1001, where 1 (binary one) arbitrarily is represented by a relatively high voltage (+V) and 0 (binary zero) by a relatively low voltage (0 volts). In the discussion which follows, when reference is made to a point at a particular binary value, this is simply a shorthand way of saying that a point is at a potential representing the particular binary value.

Referring to the waveforms of FIG. 3, during the time interval $t_1 - t_2$, the clock voltage A level present at terminal 18 is high. The levels B and C present at terminals 34 and 26, respectively, are high and low, thereby preventing transistors 10 and 30 from turning on. During this interval, capacitor 40, which had been precharged to the low voltage level during a prior clock interval, undergoes discretionary charge transfer. That is, it will charge or not charge depending upon what value of voltage D is being applied by the signal source 24 to the gate of transistor 12. If this voltage D is low, the transistor 12 is on, and capacitor 40 charges via the conduction path of this transistor to the potential +V present at terminal 18. If voltage D is high, as in the present example, transistor 12 is off and capacitor 40 remains uncharged — the voltage across it remains at zero volts. Thus, during the interval $t_1 - t_2$ data (signal D) has been transferred from input terminal 13 to capacitor 40. The transfer is accompanied by logical inversion. That is, when D = 1, capacitor 40 receives and stores a 0, and vice-versa.

Assume for a moment that capacitor 40 is charged to +V. In this case transistor 32 turns on and capacitor 42 charges through the conduction path of transistor 32 to +V. If, on the other hand, capacitor 40 is charged to 0 volts, then transistor 32 remains off and the voltage across capacitor 42 is unchanged.

During interval $t_2 - t_3$, clock voltage B at terminal 34 drops to a low level while the two remaining clock levels are unchanged. A low voltage B at terminal 34 turns on transistor 30. If capacitor 42 was charged to +V previously, it retains its charge. There may be two conduction paths, one through 30 and the other through 32 to node 18 which is at +V but this, if anything, may slightly increase the charge on capacitor 42 (but not significantly). If capacitor 42 was not charged during $t_1 - t_2$, it now charges via the conduction path of 30 to the +V level at node 18. As D does not change during $t_2 - t_3$, the voltage across capacitor 40 retains the value it assumed during $t_1 - t_2$.

During interval $t_3 - t_4$, B changes to a high level turning off transistor 30. A and C remain unchanged. Capacitors 40 and 42 retain the charges which were present during $t_2 - t_3$. During time interval $t_4 - t_5$, the voltage A at terminal 18 drops to its low level. Capacitor 42 undergoes discretionary charge transfer at this time depending on the voltage present at the gate of transistor 32. If a voltage +V is present across capacitor 40, transistor 32, which became conductive at the time the voltage across capacitor 40 increased to this value, provides a conduction path for discharging capacitor 42 to the potential present at node 18, which is zero volts at this time. If the voltage across capacitor 40 is zero volts, transistor 32 does not conduct and capacitor 42 remains charged at the +V level.

In the present example, a zero volt signal, as shown at E of FIG. 3, is present across capacitor 40 during interval $t_4 - t_5$. As a result, transistor 32 does not turn on and capacitor 42 remains charged to the +V level. Thus, an input data signal having a +V voltage level applied to terminal 13 has been shifted, in inverted form, to capacitor 40 during interval $t_1 - t_2$. Then later, at $t_4 - t_5$, the inverted signal, inverted once more, is present at capacitor 42. Thus, by virtue of the double logical inversion, the signal D present at input terminal 13 of the register stage at time $t_1 - t_2$, is present, in the same form, at time $t_4 - t_5$, at the output terminal 46 of the stage.

During interval $t_5 - t_6$, the voltage A at terminal 18 remains low, the voltage B at 34 remains high and the voltage C at terminal 26 has changed to a high level. As a result, transistor 10 is turned on and capacitor 40 precharges through the conduction path of transistor 10 to the voltage present at terminal 18, in this case, zero volts. At $t_6 - t_7$ A and B remain at their previous values and C goes low. When C goes low transistor 10 cuts off. Capacitor 40 remains charged to 0 and capacitor 42 retains whatever charge it had previously.

At time interval $t_7 - t_8$, capacitor 40 undergoes discretionary charge transfer in response to the signal present at terminal 13 in the manner already indicated.

A complete cycle of operation of the register has been described for an input signal representing binary one. The shift of a binary zero will now be described to explain an aspect of register operation not apparent in the previous circuit description. During interval $t_7 - t_8$, when a binary zero is present at terminal 13, capacitor 40 undergoes discretionary charge transfer to the +V level. The voltage across capacitor 42 is still at the +V level as a result of storage of the previous binary one pulse.

At time interval $t_8 - t_9$ capacitor 42 is precharged to the +V level thereby destroying the information content that had been stored by this capacitor. However, in a shift register array, prior to this time (that is, during $t_7 - t_8$) this information already would have been sensed and its logical complement stored in capacitor 40 of the next stage of the array, or in appropriate utilization circuitry, if the stage represents the output stage of the register. There is no change in the charge state of the capacitors during interval $t_9 - t_{10}$.

During interval $t_{10} - t_{11}$ capacitor 42 undergoes discretionary charge transfer. The presence of a positive voltage across capacitor 40 causes transistor 32 to conduct and discharge capacitor 42 to the zero volt level present at node 16. During interval $t_{11} - t_{12}$, capacitor 40 is precharged to the zero volt level. The capacitor remains charged to this level until time $t_{13}$ at which time it once more undergoes discretionary charge transfer.

It should be noted that the voltage across capacitor 40 over the interval $t_7 - t_{13}$, when a binary zero that extends over the invertal $t_4 - t_{10}$ is applied to the input terminal 13, is not the true logical complement of the input signal as was the case when a binary one was the input signal. The voltage across capacitor 40 drops to a binary zero level over the interval $t_{11} - t_{13}$ due to the precharging of this component. This results in a voltage waveform across capacitor 40 having a return-to-zero data format. That is, when the voltage is at a level representing a binary one, it will, for some predetermined time at the end of the bit interval, return to the binary zero level for the balance of the pulse interval.

A similar but complementary effect is observed in the voltage across capacitor 42. At the time interval $t_{14} - t_{15}$, capacitor 42 is precharged to a +V level independent of the voltage across capacitor 42. The voltage across capacitor 42 remains at the +V level until time $t_{16}$ at which time it undergoes discretionary charge transfer. Thus, the output voltage waveform is not the same as the input voltage, but it nevertheless readily can be interpreted in terms of 1's and 0's. It can also be shown that the wave F applied to the input to a following stage is faithfully reproduced (has the same shape) at the output of the following stage and indeed appears in the same form at the output of the register. If desired, such an output signal (of the "return-to-zero type") signal can be reconverted to conventional binary format, using standard digital techniques.

For the purposes of discussion, the clock signals have been shown in FIG. 3 in idealized form, that is, having zero rise and fall times. This may not be the situation in actual practice, but so long as each clock signal completes its voltage transition before another clock signal begins its transition, operation will be satisfactory.

For the clock pulses shown in FIG. 3, when the negative-going pulse waveform, shown at B, begins at a time T/8 after the start of each positive pulse portion of waveform A and terminates at a time T/8 before the end of this positive pulse and the positive-going pulse waveform C bears a similar timing relationship to the negative pulse portions of waveform A, the rise and fall times for each clock signal should be no greater than T/8, where T equals the period of the clock pulses. It should be appreciated that different rise and fall times requirements may exist where the waveforms shown at A, B and C of FIG. 3 bear a timing relationship relative to each other that is different from that described in the above example. The particular waveform format shown in FIG. 3 enables the charge and discharge times of capacitors 40 and 42 each to be as large as T/8. This results in fastest overall operation for a given device size and circuit power consumption. Other timing relationships require at least one switching phase to be faster than T/8 thereby requiring larger devices and more power.

The waveforms shown at E and F of FIG. 3 are also presented in idealized form, that is, with zero rise and fall times. The voltage levels shown at E and F are realized through the selective charging and discharging of circuit capacitances. Such charging and discharging does not occur in actual practice in zero time.

Figure 2:
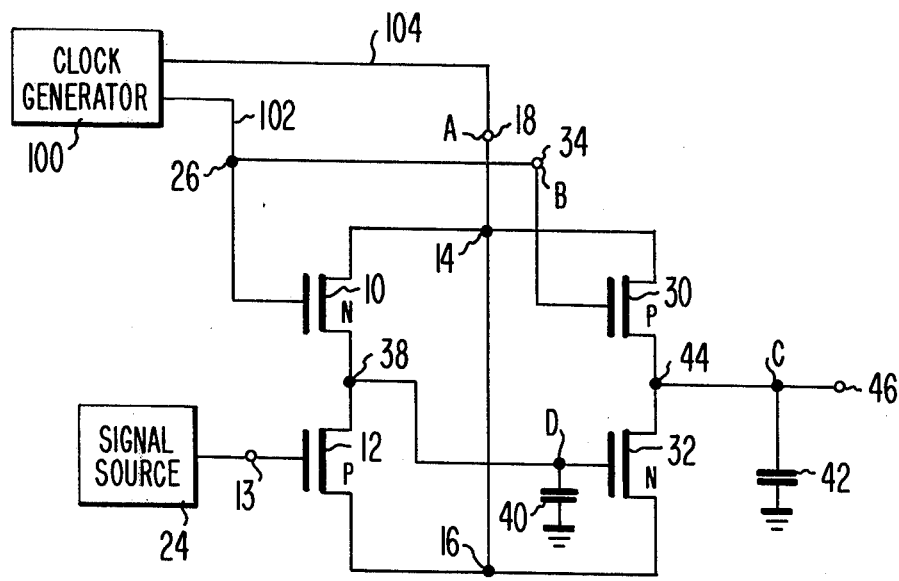
FIG. 2 is a block and schematic circuit diagram of a second embodiment of the invention.

In the circuit of FIG. 2, the circuit of FIG. 1 has been modified by the interconnection of terminals 26 and 34. This common connection is in turn connected via line 102 to clock generator 100. Terminal 18 is connected to generator 100 by line 104. Elements common to the circuits of FIGS. 1 and 2 have been given like reference designations.

Figure 4:
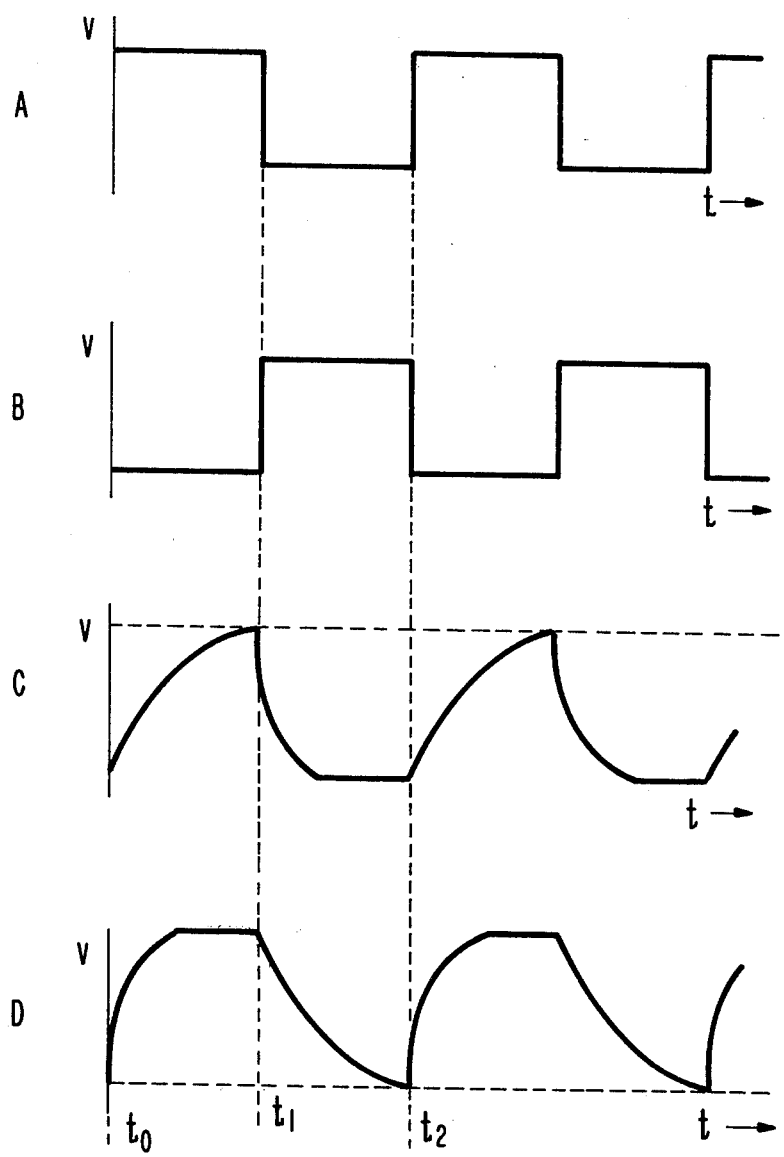

In the operation of the circuit of FIG. 2, clock generator signals applied to terminals 18 and 34 are shown at A and B, respectively, of FIG. 4. The amplitude of these signals varies between a high level of +V volts and a low level of zero volts. The principles of operation of the circuits of FIGS. 1 and 2 are similar, in that capacitors 40 and 42 are precharged to predetermined voltage levels. Each capacitor then undergoes discretionary charge transfer in response either to the level of the input signal or the voltage stored by the previous capacitor. In addition, the output voltage of the circuit of FIG. 2 has return to zero characteristics similar to those of the FIG. 1 circuit.

Referring to FIGS. 2 and 4, during time interval $t_0 - t_1$ waveforms A and B of FIG. 4 are at their high and low levels respectively. The low level voltage B at terminal 34 turns on PMOS transistor 30 which permits capacitor 42 to be precharged to the voltage level present at terminal 18, V volts. The voltage across capacitor 42 is shown at C of FIG. 4. The solid line represents the condition where the capacitor had undergone discretionary charge transfer to the zero volt level during a prior clock interval and is being charged to the +V level. The dashed line represents the condition where the discretionary charge transfer resulted in the capacitor voltage remaining at +V volts. For this latter condition, no significant charging of the capacitor occurs during interval $t_0 - t_1$.

Capacitor 40 undergoes discretionary charge transfer during interval $t_0 - t_1$. If a binary zero is present at terminal 13, PMOS transistor 12 conducts, charging capacitor 40 to the voltage present at terminal 18, +V. This condition is shown at D of FIG. 4 by the solid line. If a binary 1 is present at terminal 13, transistor 12 does not conduct and the capacitor voltage remains at the voltage level attained during a prior precharge interval, zero volts. This latter condition is shown at D by the dashed lines.

During clock interval $t_1 - t_2$, A is low, B is high and capacitor 42 undergoes discretionary charge transfer as a function of the voltage across capacitor 40. In more detail, if D is high, 32 is on and 42 charges to the zero volt level. If D is low, 32 is off and 42 remains charged to +V. During the same interval transistor 10 conducts. As a result, capacitor 40 is precharged to the voltage present at terminal 18, zero volts. It should be noted that capacitor 40 is both providing information to capacitor 42 by controlling the discretionary charge transfer for the latter device and is being precharged during the same clock interval.

To achieve precharging without destroying the stored information, the relative time constants of the circuits associated with capacitors 40 and 42 are chosen such that capacitor 42 charges relatively quickly compared to the discharge time of capacitor 40. In this manner, capacitor 42 responds to the information stored by capacitor 40 before the latter device has discharged. It should be noted that different charge rates (not drawn to scale) are shown over the $t_1 - t_2$ interval at C and D of FIG. 4. By way of example, over interval $t_1 - t_2$, the voltage across capacitor 42 may reach its final value in 1/5 of the time required for the voltage across capacitor 40 to reach its final value.

The physical size of transistors 10 and 32 may be utilized to realize control over the above time constants. In an MOS transistor having a given channel or conduction path length, the channel impedance is inversely proportional to the channel width. Thus, the desired time constant difference may be realized by making the channel width (W) of transistor 10 much greater than the width of the channel of transistor 32. Alternatively, the channel widths can be kept the same and the lengths (L) varied. In fact, both parameters, L and W can be varied as desired to obtain transistors of having minimal overall chip layout area. It can be shown that similar relationships exist with respect to the precharge time for capacitor 42 and the discretionary charge transfer time of capacitor 40. These times are shown during time interval $t_0 - t_1$ at C and D of FIG. 4, respectively. It should be noted that for the circuit of FIG. 2, capacitor 42 does not control the discretionary charge transfer of capacitor 40. However, when the circuit of FIG. 2 is used in a shift register array, there is an interreaction between capacitor 42 and a capacitor corresponding to capacitor 40 in the subsequent register stage (not shown). The desired time constant relationship may be realized, e.g., by making the channel width of transistor 12 much greater than that of transistor 30. Note that the rise and fall times of the clock pulses should be small compared to the charge and discharge times of capacitors 40 and 42.

In the circuits of FIGS. 1 and 2, capacitors 40 and 42 are shown as discrete elements. While it may be possible in some applications to achieve proper circuit operation by relying on the intrinsic transistor capacitances to realize these capacitors, there may exist under certain conditions, an undesired amount of parasitic capacitance. This parasitic capacitance may cause undesired coupling of the clock pulses between circuit points which in turn could interfere with normal circuit operation. In this case, the effective value of capacitors 40 and 42 may be increased through the use of known integrated circuit fabrication techniques. For example, where a silicon substrate is used, a conductive material, which may be the same material as the gate electrode, may be deposited on the substrate with an insulating material therebetween. Alternatively, the capacitor in this case may be the gate of a p or n transistor whose source and drain are connected together at a reference potential. This latter approach is the "dummy transistor" technique. Where an insulating substrate such as sapphire is used, the "dummy" transistor approach can be used, or the conductive material may be deposited directly onto the substrate, relying on the capacitance coupling through the substrate to the reference potential. In this latter case, the second terminal of the capacitance would be at the substrate potential which may not necessarily be ground potential. It should be noted that no additional bus is in this case required to provide a reference potential for the capacitors, thereby simplifying layout of the circuits when realized in integrated circuit form.

The circuits shown in FIGS. 1 and 2 have component counts comparable to prior arts circuits and they overcome the disadvantages of the prior art circuits by avoiding source follower operation at all times. In addition, the capacitors are charged to the full clock potential. There is no charge transfer between capacitors, which causes a loss of voltage because of the capacitive voltage divider effect. As a result the register circuit of FIG. 1 is capable of operation at very high data rates.

The circuit of FIG. 2, while not capable of operation at rates as high as the previous circuit does have the advantage of requiring one less clock line. Also, the circuitry required to produce these clock signals may be less complex than that needed to generate the clock pulses for the circuit of FIG. 1. For example, the signals shown at A and B of FIG. 4 may represent the two logical outputs of a bistable multivibrator. Both circuits have the feature of not requiring any D.C. power lines, thus simplifying the circuit layout when they are realized in integrated circuit form.

It should be appreciated that the conductivity types of the transistors of the circuits of FIGS. 1 and 2 may be reversed. If the polarities of the various control voltages are modified accordingly, circuit operation will be similar to the above descriptions.

Figure 5:
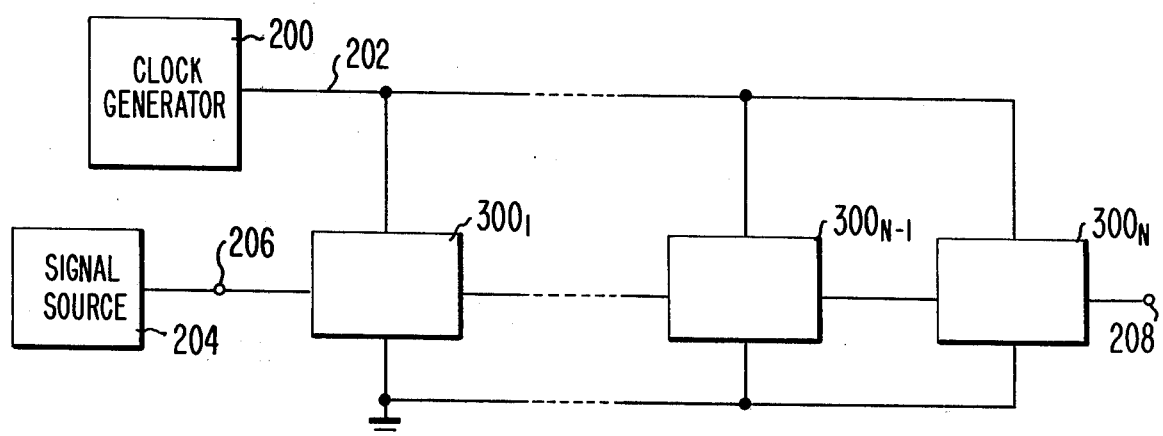
FIG. 5 is a block diagram of a shift register array which embodies the present invention.

In FIG. 5, the circuits of FIGS. 1 or 2 are utilized in an n-stage shift register. Clock generator 200 has its output signals coupled by line 202 to shift register stages $300_1$ through $300_N$. Each register stage is connected to a reference potential, herein ground. Signal source 204 is connected to the register input terminal 206 while the register output is obtained at terminal 208. Register stages $300_1$ through $300_N$ each represent the shift register stages of FIGS. 1 or 2. When the array is realized using the circuit of FIG. 1, clock output line 202 supplies the signals shown in FIG. 3. Line 202 supplies the signals shown in FIG. 4 when the register is realized using the circuit of FIG. 2.

The operation of the circuit of FIG. 5 is similar to the operation of the circuits of FIGS. 1 and 2. The output voltages of stages $300_1$ through $300_{N-1}$ comprise the input signals to stages $300_2$ through $300_N$, respectively. Data is shifted through each stage in a manner similar to that described for the circuits of FIGS. 1 and 2.

What is claimed is:

1. An integrated circuit dynamic shift register stage having an input and output terminal comprising, in combination:
    first, second and third terminals to which respective control voltages may be applied;
    first and second charge storage means coupled between a first node and a point at a reference potential and a second node and said point at said reference potential, respectively, said second node comprising said output terminal;
    a first metal-oxide-semiconductor (MOS) transistor of a first conductivity type having a conduction path and a control electrode, said conduction path connected between said first node and said first terminal and said control electrode comprising said input terminal;
    a second MOS transistor of a second conductivity type having a conduction path and a control electrode, said second transistor conduction path connected in parallel connection with said first transistor conduction path and said second transistor control electrode connected to said second terminal;
    a third MOS transistor of said second conductivity type having a conduction path and a control electrode, said third transistor conduction path connected between said second node and said first terminal and said third transistor control electrode connected to said first node; and
    a fourth MOS transistor of said first conductivity type having a conduction path and a control electrode, said fourth transistor conduction path connected in parallel connection with said third transistor conduction path and said fourth transistor control electrode connected to said third terminal.

2. A shift register cell comprising, in combination;
    first, second, third and fourth transistors, said first and fourth transistors being of a first conductivity type and said second and third transistors being of a second conductivity type, each having a conduction path and a control electrode for controlling the conductivity of said path;
    first and second capacitances;
    means responsive to a control voltage applied to the control electrode of said first transistor for precharging said first capacitance to a reference voltage level through the conduction path of said first transistor;
    means responsive to a signal applied to the control electrode of said second transistor for changing the level of charge stored in said first capacitance, via the conduction path of said second transistor, when the signal lever is such that the second transistor turns on and for retaining the charge stored in said first capacitance at its reference level when the signal level is such that said second transistor remains off;
    means responsive to a control signal applied to the control electrode of said third transistor for precharging said second capacitance to a reference voltage level through the conduction path of said third transistor; and
    the control electrode of said fourth transistor being coupled to said first capacitance and responsive to the voltage thereat for changing the level of the charge stored in said second capacitance via the conduction path of said fourth transistor, when the charge stored in said first capacitance is at one level, and for maintaining said fourth transistor cut off when the charge stored in said first capacitance is at a second level, thereby retaining the charge stored in said second capacitance at its reference level.

3. The combination recited in claim 2 wherein said means for precharging said first capacitance comprises a terminal coupled through said first transistor conduction path to one terminal of said capacitance, said terminal at a potential representing a first binary value.

4. The combination recited in claim 3 wherein the means for precharging said second capacitance comprises a terminal coupled through said third transistor conduction path to one terminal of said second capacitance, said terminal at a potential representing a second binary value.

5. The combination recited in claim 2 wherein said first and fourth transistors comprise metal-oxide-semiconductor (MOS) transistors of a first conductivity type and said second and third transistors comprise MOS transistors of a second conductivity type.

6. The combination recited in claim 5 wherein the conduction path impedances of said first and third transistors is large compared with the conduction path impedances of said fourth and second transistors, respectively.

7. A dynamic shift register stage comprising:
    first, second and third terminals;
    four switches, said switches being the sole switches in said stage, each switch including a conduction path and control means for controlling the impedance of said conduction path, the conduction paths of the first and second of said switches connected between said first and second terminals, the conduction paths of the third and fourth of said switches connected between said first and third terminals;
    two capacitances, one connected between said second terminal and a point of reference potential and the other between said third terminal and said point of reference potential;
    a direct connection between said second terminal and the control means of said fourth transistor;

an input terminal for said stage at the control means of said second switch;

an output terminal for said stage at said third terminal;

means coupled to the control means of said first and third switches for concurrently closing said first switch and opening said third switch and for concurrently closing said third switch and opening said first switch; and means coupled to said first terminal for applying a signal thereto having first and second voltage levels, said signal assuming said first level during the interval when said first switch is closed and said second level during the interval when said first switch is open.

8. The combination as set forth in claim 7 wherein said means coupled to the control means of said first and third switches comprises first and second signal sources coupled to the control means of said first and third switches, respectively.

9. The combination as set forth in claim 7 further including a direct current connection between the control means of said first and third switches.

10. The combination as set forth in claim 9 wherein said means coupled to the control means of said first and third switches comprises a signal source connected to said direct current connection.

11. The combination as set forth in claim 7 wherein said four switches comprise first, second, third and fourth metal-oxide-semiconductor transistor respectively, each transistor having a conduction path and a control electrode, said control electrode comprising said control means.

12. The combination as set forth in claim 11 wherein said first and fourth transistors are of a first conductivity type and said second and third transistors are of a second conductivity type.

* * * * *